(12) United States Patent
Smith

(10) Patent No.: US 12,088,229 B2
(45) Date of Patent: Sep. 10, 2024

(54) SYSTEMS AND METHODS FOR CONTROLLING MOTOR IMPEDANCE

(71) Applicant: The Boeing Company, Chicago, IL (US)

(72) Inventor: Carson Alexander Smith, Ellisville, MO (US)

(73) Assignee: The Boeing Company, Chicago, IL (US)

( * ) Notice: Subject to any disclaimer, the term of this patent is extended or adjusted under 35 U.S.C. 154(b) by 317 days.

(21) Appl. No.: 17/479,319

(22) Filed: Sep. 20, 2021

(65) Prior Publication Data

US 2022/0173688 A1 Jun. 2, 2022

Related U.S. Application Data

(60) Provisional application No. 63/119,626, filed on Nov. 30, 2020.

(51) Int. Cl.
| | | |
|---|---|---|
| *H02P 29/00* | (2016.01) | |
| *B64D 27/24* | (2024.01) | |
| *B64D 31/00* | (2024.01) | |
| *H03H 7/38* | (2006.01) | |

(52) U.S. Cl.
CPC .............. *H02P 29/00* (2013.01); *B64D 27/24* (2013.01); *B64D 31/00* (2013.01); *H03H 7/38* (2013.01)

(58) Field of Classification Search
CPC ......... H02P 29/00; B64D 27/24; B64D 31/00; H03H 7/38

USPC ........................................................ 318/508
See application file for complete search history.

(56) References Cited

U.S. PATENT DOCUMENTS

| | | | |
|---|---|---|---|
| 2017/0207662 A1 | 7/2017 | Kanagawa et al. | |
| 2019/0341857 A1* | 11/2019 | Shin ...................... | H02M 1/143 |

FOREIGN PATENT DOCUMENTS

| | | | | |
|---|---|---|---|---|
| CN | 107819397 A | * | 3/2018 | |
| CN | 108363877 A | * | 8/2018 | ............. G06F 30/20 |

OTHER PUBLICATIONS

Extended European Search Report mailed Feb. 23, 2022 from corresponding European application No. EP 21 20 0109, 8 pages.
Riehl et al., "Analysis and Methodology for Determining the Parasitic Capacitances in VSI-fed IM Drives Based on PWM Technique," Nov. 18, 2015, IntechOpen, DOI: 10.5772/61544, 38 pages. Retrieved from the Internet. Retrieved from https://www.intechopen.com/books/induction-motors-applications-control-and-fault-diagnostics/analysis-and-methodology-for-determining-the-parasitic-capacitances-in-vsi-fed-im-drives-based-on-pw on Nov. 13, 2020.

* cited by examiner

*Primary Examiner* — Kawing Chan
(74) *Attorney, Agent, or Firm* — Haynes and Boone, LLP

(57) ABSTRACT

Methods and apparatuses for controlling the effects generated by a motor. In one or more examples, a circuit system is configured to be coupled to a motor such that the circuit system reduces a variation in an impedance of the motor within a range of frequencies that includes a resonant frequency of the motor.

20 Claims, 12 Drawing Sheets

SYSTEMS AND METHODS FOR CONTROLLING MOTOR IMPEDANCE

CROSS-REFERENCE TO RELATED APPLICATION

This application claims priority to U.S. Provisional Patent Application No. 63/119,626 filed on Nov. 30, 2020, entitled "Systems And Methods For Controlling Motor Impedance," which is incorporated herein by reference in its entirety.

FIELD

This disclosure generally relates to electric motors and, more particularly, to systems and methods for controlling the effects of an electric motor on its surrounding environment using a circuit system coupled to the electric motor.

BACKGROUND

An electric motor is a machine that converts electrical energy into mechanical energy. The various different types of electric motors include direct current (DC) motors, alternating current (AC) motors, magnet-based motors (e.g., a permanent magnet motor, etc.), induction motors (e.g., a three-phase induction motor), brushed motors, brushless motors, as well as other types of motors.

In some cases, parasitics are present within an electric motor. These parasitics, which may include parasitic capacitances, parasitic resistances, parasitic inductances, or a combination thereof, are a result of motor design, assembly, and/or installation. The broad spectral content associated with electrical switching of the control system of the electric motor may excite these parasitics. This excitation, in turn, may drive transient effects (e.g., transient voltages, transient currents, etc.) onto structure surrounding the electric motor at electrical resonance. These transient effects can have undesired consequences. For example, when the electric motor is used in a vehicle, the transient effects may generate undesired interference with other components or systems of the vehicle.

SUMMARY

In one example embodiment, a system comprises a circuit system configured to be coupled to a motor such that the circuit system reduces a variation in an impedance of the motor within a range of frequencies that includes a resonant frequency of the motor.

In another example embodiment, a motor system comprises an electric motor and a circuit system coupled to the electric motor. The circuit system is configured to reduce a difference between a lowest common mode (CM) impedance and a highest common mode impedance of the electric motor within a range of frequencies that includes a resonant frequency of the electric motor.

In yet another example embodiment, a method for controlling effects generated by a motor is provided. A circuit system is coupled to a motor. A variation in an impedance of the motor is reduced within a range of frequencies that includes a resonant frequency of the motor using the circuit system.

In another example embodiment, a method is provided for developing a circuit system to control effects generated by a motor. Baseline impedance information is generated for a reference motor. A motor circuit model of the reference motor is generated using the baseline impedance information for the reference motor. A suppression circuit model of the circuit system is generated using the motor circuit model such that the circuit system is configured to reduce a variation in an impedance of the motor within a range of frequencies that includes a resonant frequency of the motor when the circuit system is coupled to the motor.

In yet another example embodiment, a non-transitory computer-readable medium, storing computer instructions thereon, is provided. The non-transitory computer-readable medium comprises machine-executable code that, when run by at least one machine, causes the at least one machine to: generate a set of baseline impedance curves corresponding to the motor using a network analyzer; generate a motor circuit model of the motor using the set of baseline impedance curves; and generate a suppression circuit model for a circuit system using the motor circuit model such that the circuit system is configured to reduce a variation in the impedance of the motor within a range of frequencies that includes a resonant frequency of the motor when the circuit system is coupled to the motor.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the example embodiments are set forth in the appended claims. The example embodiments, however, as well as a preferred mode of use, further objectives and features thereof, will best be understood by reference to the following detailed description of an example embodiment of the present disclosure when read in conjunction with the accompanying drawings.

DETAILED DESCRIPTION

Figure 1:
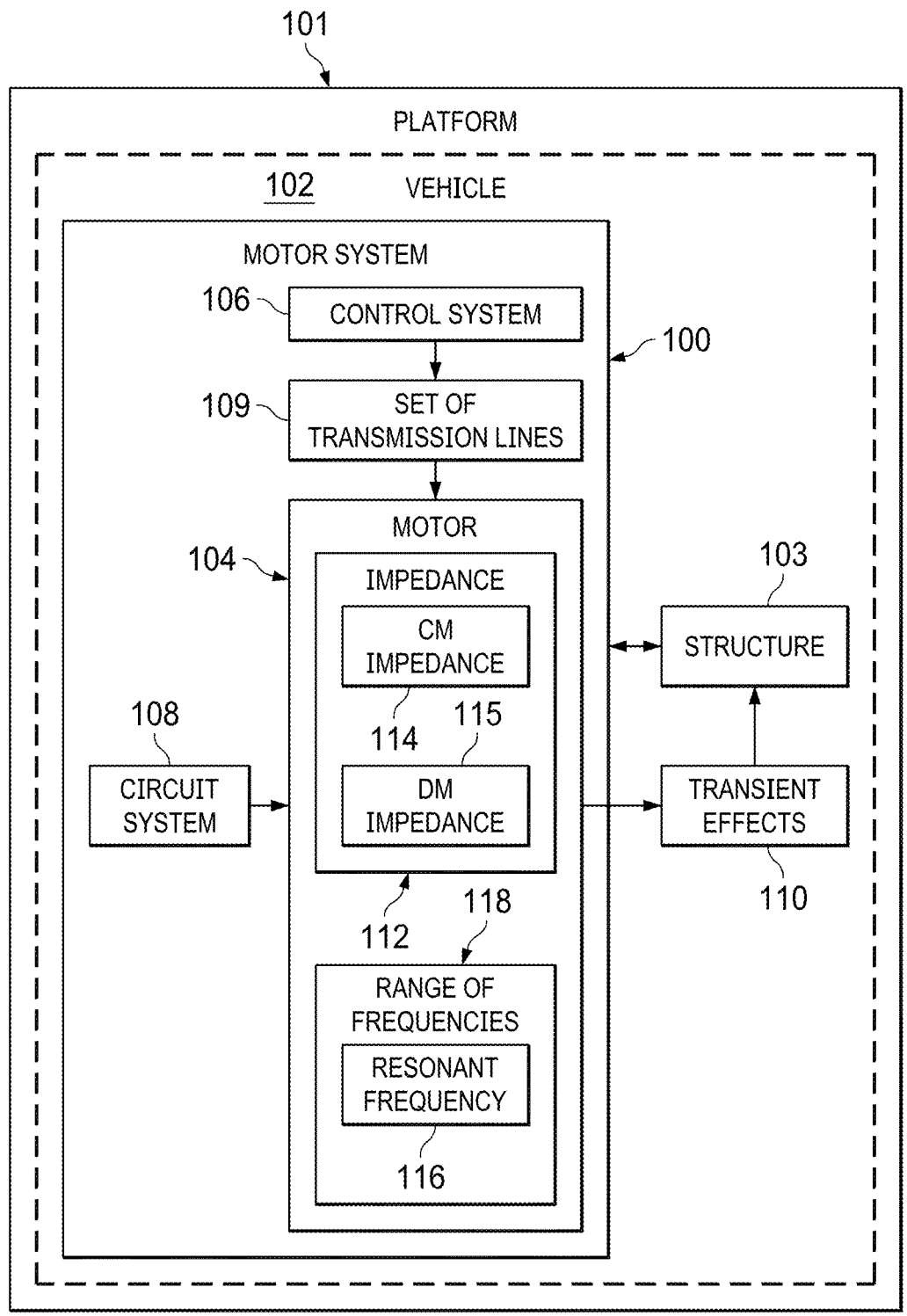
FIG. 1 is a block diagram of a motor system of a vehicle in accordance with one or more example embodiments.

The example embodiments described below provide methods and systems for controlling the effects of motors and, in particular, electric motors. In particular, the various example embodiments provide methods and systems for reducing or suppressing transient effects generated at or near electrical resonance within a motor. These transient effects may include transient voltages and transient currents.

The example embodiments described herein recognize and take into account that certain types of vehicles use electric motors to generate high power levels. For example, various types of aircraft (e.g., electric vertical takeoff and landing (eVTOL) aircraft) may be battery-powered and generate lift via multiple electric motors. These motors may be controlled by, for example, electric speed controllers (ESC) that excite electrical resonances within the motors. This electrical resonance, however, may generate transient effects, such as undesired high amplitude CM voltages, CM currents, or both that are driven into the motor's surrounding environment. The surrounding environment may include structure, such as the frame or chassis of the vehicle.

Because the electrical resonance of a motor is generally based on the physical construction of that motor, different motors have different electrical resonances. Accordingly, understanding the transient effects produced at and near the resonant frequency of a particular motor or type of motor may be challenging. Thus, the example embodiments provide methods and systems for generating a motor circuit model having a configuration that can be generally used to represent different types of motors. This motor circuit model can then be customized to represent individual motors. Further, a motor circuit model customized for a particular motor is then used to design and develop a circuit system for controlling (e.g., reducing or suppressing) the transient effects that may be generated by that particular motor at and near the resonant frequency for the motor.

In particular, the various example embodiments describe a circuit system that modifies the impedance of a motor. More specifically, the circuit system reduces a variation in an impedance (e.g., CM impedance) of the motor within a range of frequencies that includes the resonant frequency of the motor. Reducing this variation, which raises the common mode impedance at the resonant frequency, reduces or suppresses transient effects that may be produced by the motor.

This type of circuit system may be lower in cost, weight, or both as compared to using transmission line filters, decoupling capacitors, CM chokes, ferrites, etc. Further, this type of circuit system may be easily and effectively adapted for use with multiple motors. Accordingly, this type of circuit system may be particularly well-suited for use in controlling the effects of electric motors used in light-weight vehicles that require high power.

Thus, in one example embodiment, a system comprises a circuit system configured to be coupled to a motor. The circuit system is coupled to the motor such that the circuit system reduces a variation in an impedance of the motor within a range of frequencies that includes a resonant frequency of the motor. This circuit system is designed and developed using a motor circuit model that represents the motor. This configuration of this motor circuit model may be used with respect to other motors of similar or different types, to design and develop circuit systems for coupling to the other motors.

Referring now to the figures, FIG. 1 is a block diagram of a motor system 100 in accordance with one or more example embodiments. In one or more examples, motor system 100 may be used to generate motive power for platform 101. Platform 101 may take different forms.

In one or more examples, platform 101 takes the form of vehicle 102. Vehicle 102 may take the form of, for example, without limitation, an aircraft, a spacecraft, an unmanned aerial vehicle (UAV), another type of aerospace vehicle, a ground vehicle, or other type of vehicle. In other examples, platform 101 may be a piece of machinery, a tool, an electric device, equipment, some other type of platform that operates using motive power, or a combination thereof.

Motor system 100 may be coupled to platform 101 in different ways. For example, motor system 100 may be physically associated with structure 103 and structure 103 may be physically associated with motor system 100. This physical association may be provided via directly or indirectly coupling motor system 100 to structure 103 of platform 101. Structure 103 may include a housing, a frame (e.g., a chassis), one or more structural members, a mounting structure or device, some other type of structure, or a combination thereof.

When platform 101 takes the form of vehicle 102, structure 103 may include a chassis of vehicle 102. Motor system 100 may be associated with the chassis by at least a portion of motor system 100 being mounted (or directly attached) to the chassis. In other examples, motor system 100 may be indirectly attached to the chassis. For example, motor system 100 may be attached to another structural component that is itself attached to the chassis directly or indirectly.

Motor system 100 includes motor 104, control system 106, and circuit system 108. Motor 104 is an electric motor and may take any of a number of different forms. For example, the electric motor may be a direct current (DC) motor, an alternating current (AC) motor, an electromagnetic motor, a magnet-based motor (e.g., a permanent magnet motor, etc.), an induction motor (e.g., a three-phase induction motor), a brushed motor, a brushless motor, or some other type of motor. In some cases, the electric motor may be a combination or integration of two or more motors, which may be of the same type or of different types.

Control system 106 is used to control the operation of motor 104. Control system 106 may be implemented using hardware, software, firmware, or a combination thereof. In one or more examples, control system 106 is separate from but coupled to motor 104. For example, set of transmission lines 109 may connect control system 106 to motor 104. In other examples, at least a portion of control system 106 is implemented within or integrated as part of motor 104.

Control system 106 controls the electrical energy that is driven into motor 104. In one or more examples, control system 106 includes variable speed control. In some examples, control system 106 controls and drives the operation of motor 104 using any number of power semiconductor devices (e.g., insulated gate bipolar transistor (IGBT) devices, metal-oxide-semiconductor field-effect transistor (MOSFET) devices, etc.).

Circuit system 108 may be considered separate from motor 104 and separate from control system 106 but coupled to motor 104, control system 106, or both. In other examples, at least a portion of circuit system 108 may be implemented within or otherwise integrated as part of control system 106, motor 104, or both.

Circuit system 108 is used to control transient effects 110 of motor 104. Transient effects 110 may include transient currents, transient voltages, another type of transient electromagnetic effect, or a combination thereof. In one or more examples, transient effects 110 are driven onto structure 103 of platform 101 and affect platform 101 in an undesired manner. For example, transient currents, transient voltages, or both may generate radiofrequency interference, interfere with power systems, interfere with communications, interfere with platform systems or operations (e.g., avionic operations, etc.), generate undesired noise, or a combination thereof.

In one or more examples, circuit system 108 is used to reduce (or suppress) transient effects 110 by controlling one or more characteristics of motor 104. For example, circuit system 108 may be used to control impedance 112 of motor 104. Impedance 112 includes common mode (CM) impedance 114, differential mode impedance 115, or both. By controlling impedance 112 of motor 104, circuit system 108 can reduce (or suppress) transient effects 110 on structure 103 of vehicle 102 that may arise due to undesired levels of impedance 112.

For example, common mode impedance 114 may be lowest at resonant frequency 116 of motor 104. Parasitics (e.g., parasitic capacitances, parasitic inductances, etc.) that exist within motor 104 may cause the steep drop in common mode impedance 114 that occurs near and at resonant frequency ($f_r$) 116. This drop in common mode impedance 114 may produce common mode noise that may be driven onto structure 103 in the form of transient effects 110. Circuit system 108 is used to raise common mode impedance 114 at and near resonant frequency 116 to reduce (or suppress) such transient effects 110.

In one or more examples, circuit system 108 raises common mode impedance 114 within range of frequencies 118 that includes resonant frequency 116. In particular, circuit system 108 may reduce a variation in common mode impedance 114 within range of frequencies 118. For example, circuit system 108 may reduce a difference between a lowest impedance and a highest impedance of common mode impedance 114 of motor 104 within range of frequencies 118.

Figure 2:
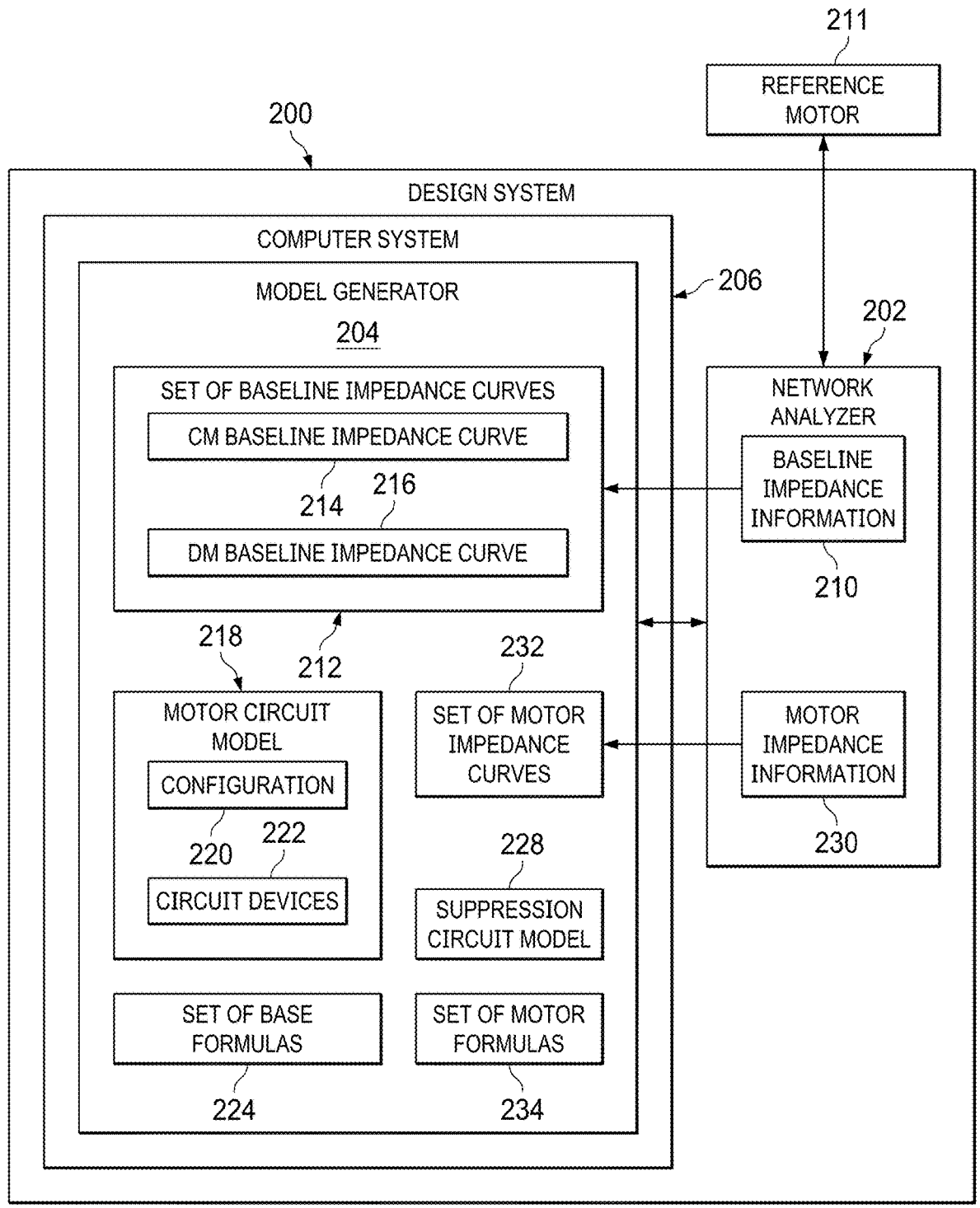
FIG. 2 is a block diagram of a design system in accordance with one or more example embodiments.

FIG. 2 is a block diagram of a design system 200 in accordance with one or more example embodiments. Design system 200 is used to design circuit system 108 in FIG. 1. In one or more examples, design system 200 includes network analyzer 202 and model generator 204. Model generator 204 and network analyzer 202 may be in communication with each other.

Model generator 204 may be implemented using hardware, software, firmware, or a combination thereof. In one or more examples, model generator 204 is implemented using computer system 206. Computer system 206 may include a single computer or one or more computers in communication with each other.

Network analyzer 202 is an instrument used to measure the parameters of electrical networks. In these examples, network analyzer 202 is used to generate S-parameter measurements that are used to generate one or more impedance curves. For example, network analyzer 202 may be used to generate baseline impedance information 210 for reference motor 211. Reference motor 211 may be, for example, motor 104 in FIG. 1 or another type of electric motor. Baseline impedance information 210 is sent to model generator 204 for processing.

In one or more examples, baseline impedance information 210 includes S-parameter measurements that are made for reference motor 211. S-parameter measurements may be used to generate set of baseline impedance curves 212 for reference motor 211. For example, model generator 204 may generate set of baseline impedance curves 212 using the S-parameter measurements generated for reference motor 211 by network analyzer 202.

In other examples, baseline impedance information 210 generated by network analyzer 202 includes set of baseline impedance curves 212, which may be generated using S-parameter measurements made by network analyzer 202.

As used herein, an impedance curve, such as a baseline impedance curve of set of baseline impedance curves 212, tracks impedance versus frequency. Set of baseline impedance curves 212 may include, for example, common mode (CM) baseline impedance curve 214, differential mode (DM) baseline impedance curve 216, or both.

Model generator 204 uses baseline impedance information 210 received from network analyzer 202 to generate motor circuit model 218. For example, model generator 204 may identify set of baseline impedance curves 212 in baseline impedance information 210 or generate set of baseline impedance curves 212 using the S-parameter measurements in baseline impedance information 210. Model generator 204 approximates motor circuit model 218 using set of baseline impedance curves 212.

Motor circuit model 218 is a model of an electronic circuit that represents the behavior of reference motor 211. In one or more examples, motor circuit model 218 is generated such that motor circuit model 218 includes configuration 220 of a plurality of circuit devices 222. Circuit devices 222 include capacitors, inductors, and resistors. Configuration 220 defines how circuit devices 222 (e.g., the various capacitors, inductors, and resistors) of motor circuit model 218 are connected or coupled together.

Configuration 220 of motor circuit model 218 may be used to model the behavior of different motors (e.g., at least two different types of motors) using different values for circuit devices 222. For example, configuration 220 may be independent of the values assigned to each of circuit devices 222. Different testing may be used to identify which values to assign to each of circuit devices 222 to customize configuration 220 for different motors. But configuration 220 may itself be applicable to these different motors and not require any modification in how circuit devices 222 are arranged or electrically connected or coupled to each other.

In one or more examples, set of base formulas 224 is generated based on configuration 220 for motor circuit model 218. For example, a formula of set of base formulas 224 may be generated based on at least a portion of configuration 220. Set of base formulas 224 may be used to identify the values for each of circuit devices 222 in configuration 220.

For a particular type of motor, configuration 220 and set of base formulas 224 may be used to provide a customized representation for that particular type of motor. For example, a network analyzer, which may be network analyzer 202 or a different network analyzer, may be used to generate motor impedance information 230. Similar to baseline impedance information 210, motor impedance information 230 may include S-parameter measurements that are used to generate set of motor impedance curves 232 or may include set of motor impedance curves 232.

Model generator 204 receives motor impedance information 230 and uses motor impedance information 230 and set of base formulas 224 corresponding to configuration 220 for motor circuit model 218 to identify set of motor formulas 234. For example, values may be identified for set of base formulas 224 to transform set of base formulas 224 into set of motor formulas 234.

Set of motor formulas 234 may then be used to develop suppression circuit model 228 for the particular motor, which may be motor 104. Suppression circuit model 228 may be used to build a circuit system, such as circuit system 108 in FIG. 1, that can be coupled to the particular motor, which may be motor 104, to reduce or suppress transient effects 110. Thus, in one or more example embodiments, the motor may be operated and a variation in an impedance of the motor within a range of frequencies that includes a resonant frequency of the motor reduced using a circuit system.

The block diagrams of FIGS. 1 and 2 are not meant to imply physical or architectural limitations to the manner in which an example embodiment may be implemented. Other components in addition to or in place of the ones illustrated may be used. Some components may be optional. Further, the blocks are presented to illustrate functional components. One or more of these blocks may be combined, divided, or combined and divided into different blocks when implemented in an example embodiment.

For example, suppression circuit model 228 is described above generally with respect to reducing variation in common mode impedance 114 of motor 104 in FIG. 1 at and near the electrical resonance of motor 104. But in other examples, suppression circuit model 228 may be generated to additionally or instead, modify the differential mode impedance 115 of motor 104 at or near the electrical resonance of motor 104.

Figure 3:
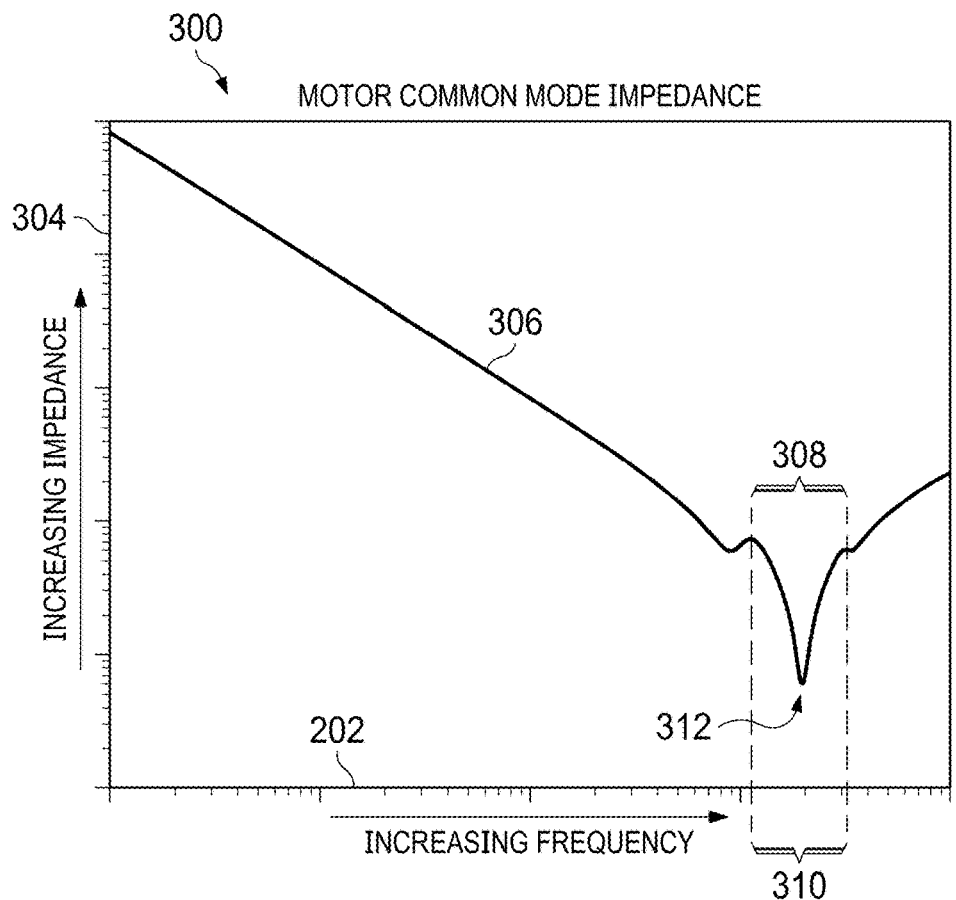
FIG. 3 is an illustration of a common mode impedance plot for a reference motor in accordance with one or more example embodiments.

FIG. 3 is an illustration of a plot of common mode impedance in accordance with one or more example embodiments. Plot 300 illustrates the common mode impedance for a reference motor, such as reference motor 211 in FIG. 2. Plot 300 includes x-axis 302 that represents frequency and y-axis 304 that represents common mode impedance.

Curve 306 is a CM impedance curve. Curve 306 may be one example of an implementation for CM baseline impedance curve 214 in FIG. 2. For example, curve 306 may be generated by a network analyzer, such as network analyzer 202 in FIG. 2, or a model generator, such as model generator 204 in FIG. 2.

Portion 308 of curve 306 corresponds to range of frequencies 310, which may be one example of an implementation for range of frequencies 118 in FIG. 1. Range of frequencies 310 includes the resonant frequency of the reference motor. Further, portion 308 of curve 306 has trough 312 at the resonant frequency of the reference motor. Trough 312 is the lowest common mode impedance for the reference motor.

Figure 4:
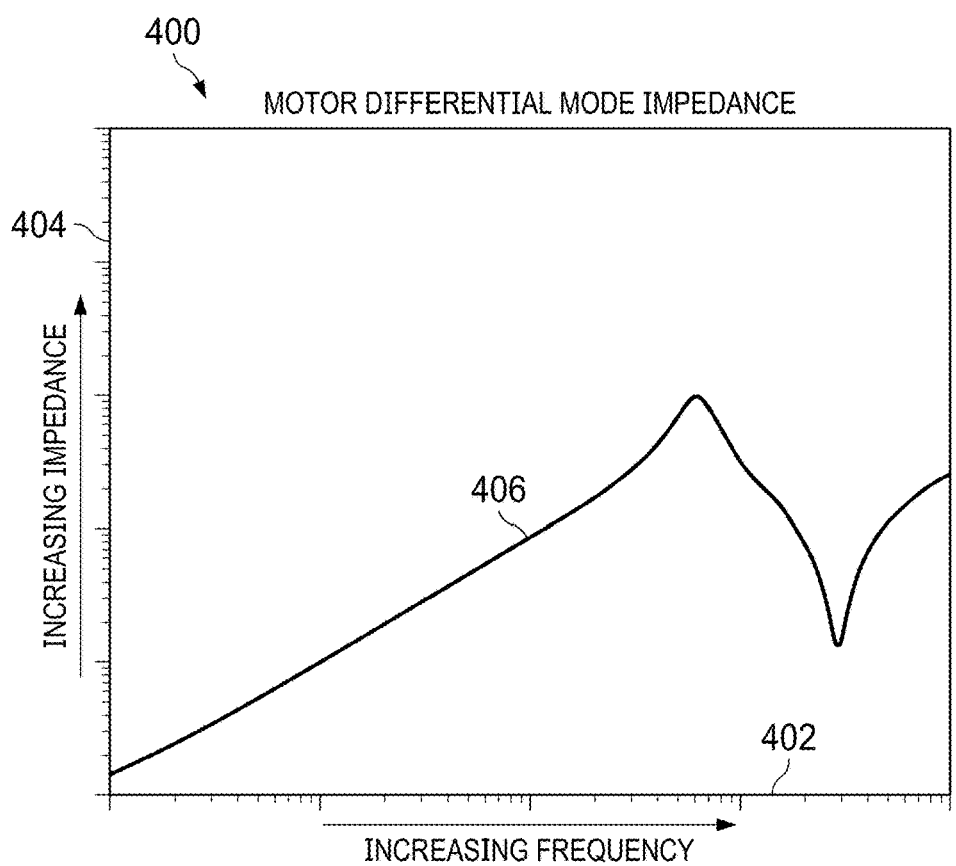
FIG. 4 is an illustration of a differential mode impedance plot for a reference motor in accordance with one or more example embodiments.

FIG. 4 is an illustration of a plot of differential mode (DM) impedance in accordance with one or more example embodiments. Plot 400 illustrates the DM impedance for a reference motor, such as reference motor 211 in FIG. 2. Plot 400 includes x-axis 402 that represents frequency and y-axis 404 that represents DM impedance.

Curve 406 is a DM impedance curve. Curve 406 may be one example of an implementation for DM baseline impedance curve 216 in FIG. 2. For example, curve 406 may be generated by a network analyzer, such as network analyzer 202 in FIG. 2, or a model generator, such as model generator 204 in FIG. 2.

Figure 5:
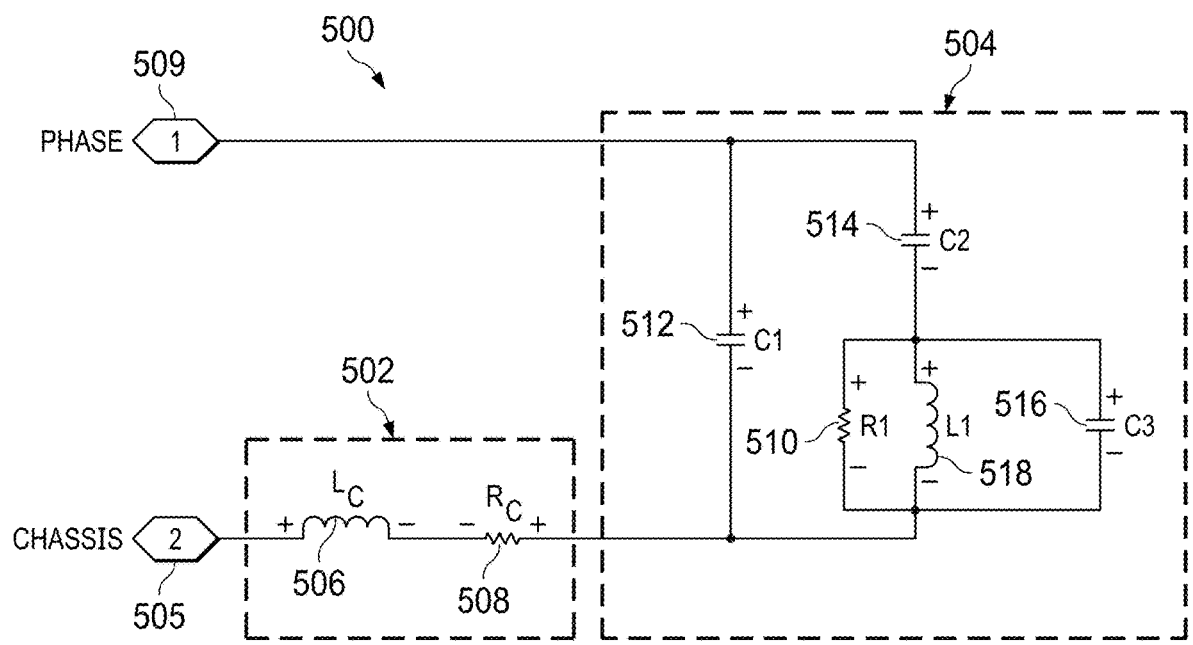
FIG. 5 is a schematic diagram of a section of a motor circuit model in accordance with one or more example embodiments.

FIG. 5 is a schematic diagram of a first circuit model in accordance with one or more example embodiments. In one or more examples, first circuit model 500 includes structure portion 502 and phase portion 504. First circuit model 500 is one example of an implementation for at least a portion of motor circuit model 218 in FIG. 2.

The configuration of structure portion 502 and phase portion 504 includes the circuit devices that are included in these portions, as well as their arrangement and connection to each other. This configuration may be determined based on plot 300 in FIG. 3. In particular, the shape of curve 306, the CM impedance curve, may be used to determine the configurations of structure portion 502 and phase portion 504.

Structure portion 502 represents at least a portion of a motor that is electrically connected to structural component 505. Structural component 505 may be or may be a component of, for example, structure 103 in FIG. 1. Structure portion 502 includes inductor 506 and resistor 508.

Phase portion 504 represents at least a portion of a motor that is electrically connected to phase line 509, which carries current of a corresponding phase. Phase portion 504 includes resistor 510, capacitor 512, capacitor 514, capacitor 516, and inductor 518.

The common mode impedance that exists between the structure and phase line 509 may be represented by the following equation:

$$Z_{CM} = \frac{1}{3}\left[R_C + j\omega L_C + \cfrac{1}{j\omega C_1 + \cfrac{1}{\cfrac{1}{j\omega C_2} + \cfrac{1}{\cfrac{1}{R_1} + j\omega C_3 + \cfrac{1}{j\omega L_1}}}}\right]. \quad (1)$$

Equation (1) is one example of an implementation for a formula of set of base formulas 224 in FIG. 2. In other words, equation (1) may be a base formula that can be used to generically represent at least a portion of a motor circuit model. Equation (1) may then be solved, based on curve 306 in FIG. 3, for the values of the various resistors, capacitors, and inductors in structure portion 502 and phase portion 504. In one or more examples, solving for these values customizes equation (1) for the motor for which curve 306 in FIG. 3 was generated, transforming this base formula into a motor formula, such as one of set of motor formulas 234 in FIG. 2.

Figure 6:
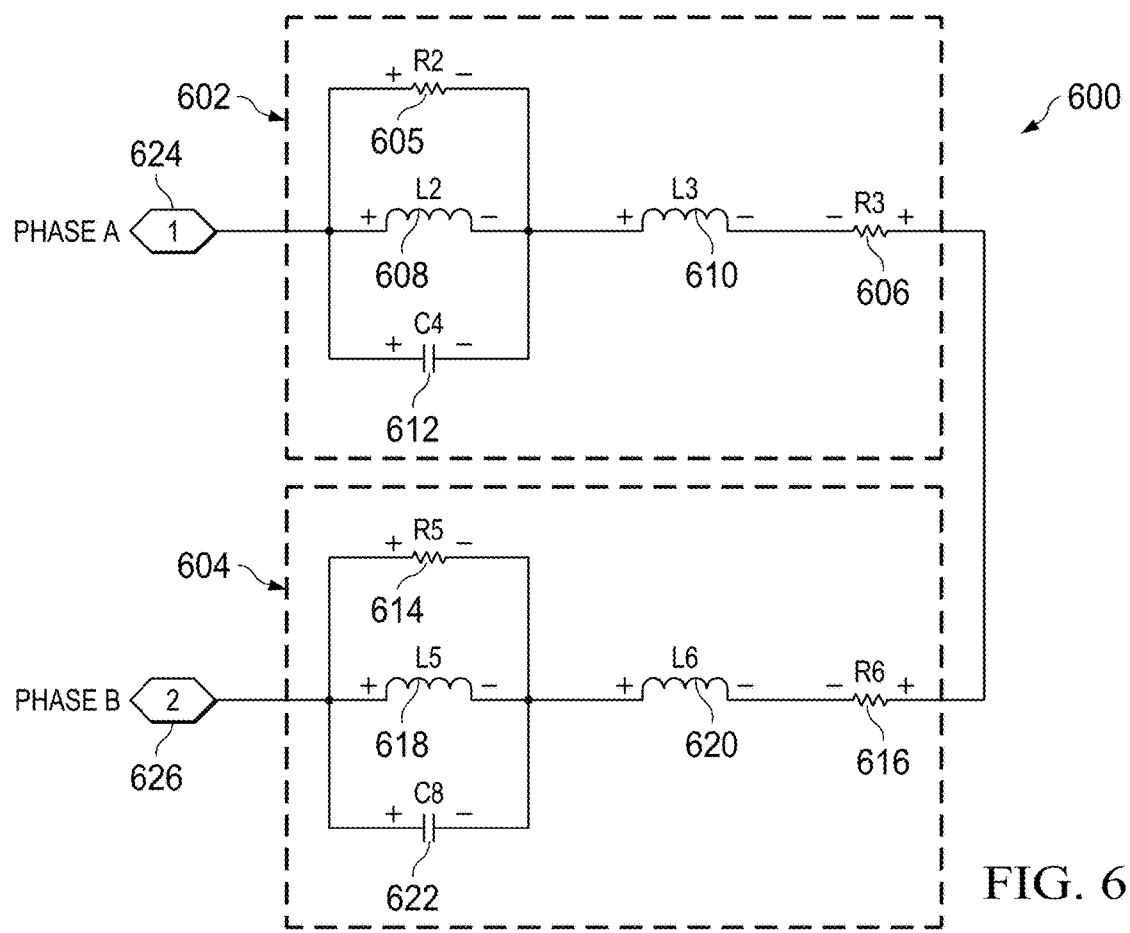
FIG. 6 is a schematic diagram of a section of a motor circuit model in accordance with one or more example embodiments.

FIG. 6 is a schematic diagram of a second motor circuit model in accordance with one or more example embodiments. In one or more examples, second circuit model 600 includes first phase portion 602 and second phase portion 604.

The configuration of first phase portion 602 and second phase portion 604 includes the circuit devices that are included in these portions, as well as their arrangement and connection to each other. This configuration may be determined based on plot 400 in FIG. 4. In particular, the shape of curve 406, the DM impedance curve, may be used to determine the configurations of first phase portion 602 and second phase portion 604.

First phase portion 602 and second phase portion 604 are identical in this example. First phase portion 602 includes resistor 605, resistor 606, inductor 608, inductor 610, and capacitor 612. Second phase portion 604 includes resistor 614, resistor 616, inductor 618, inductor 620, and capacitor 622.

First phase portion 602 and second phase portion 604 each represent at least a portion of a motor that is electrically connected to a phase line. For example, first phase portion 602 may be connected to phase line 624 and second phase portion 604 may be connected phase line 626. Phase line 624 and phase line 626 may each represent a current of a different phase.

The differential mode impedance that exists between two phase lines (e.g., two phases a of a three-phase power supply), such as phase line 624 and phase line 626, may be represented by the following equation:

$$Z_{DM} = \frac{2}{3}\left[\frac{1}{\frac{1}{R_2} + j\omega C_4 + \frac{1}{j\omega L_2}} + j\omega L_3 + R_3\right]. \quad (2)$$

Equation (2) is one example of an implementation for a formula of set of base formulas 224 in FIG. 2. In other words, equation (2) may be a base formula that can be used to generically represent at least a portion of a motor circuit model. Equation (2) may then be solved, based on curve 406 in FIG. 4, for the values of the various resistors, capacitors, and inductors in first phase portion 602 and second phase portion 604. In one or more examples, solving for these values customizes equation (2) for the particular motor for which curve 406 was generated, transforming this base formula into a motor formula, such as one of set of motor formulas 234 in FIG. 2.

Figure 7:
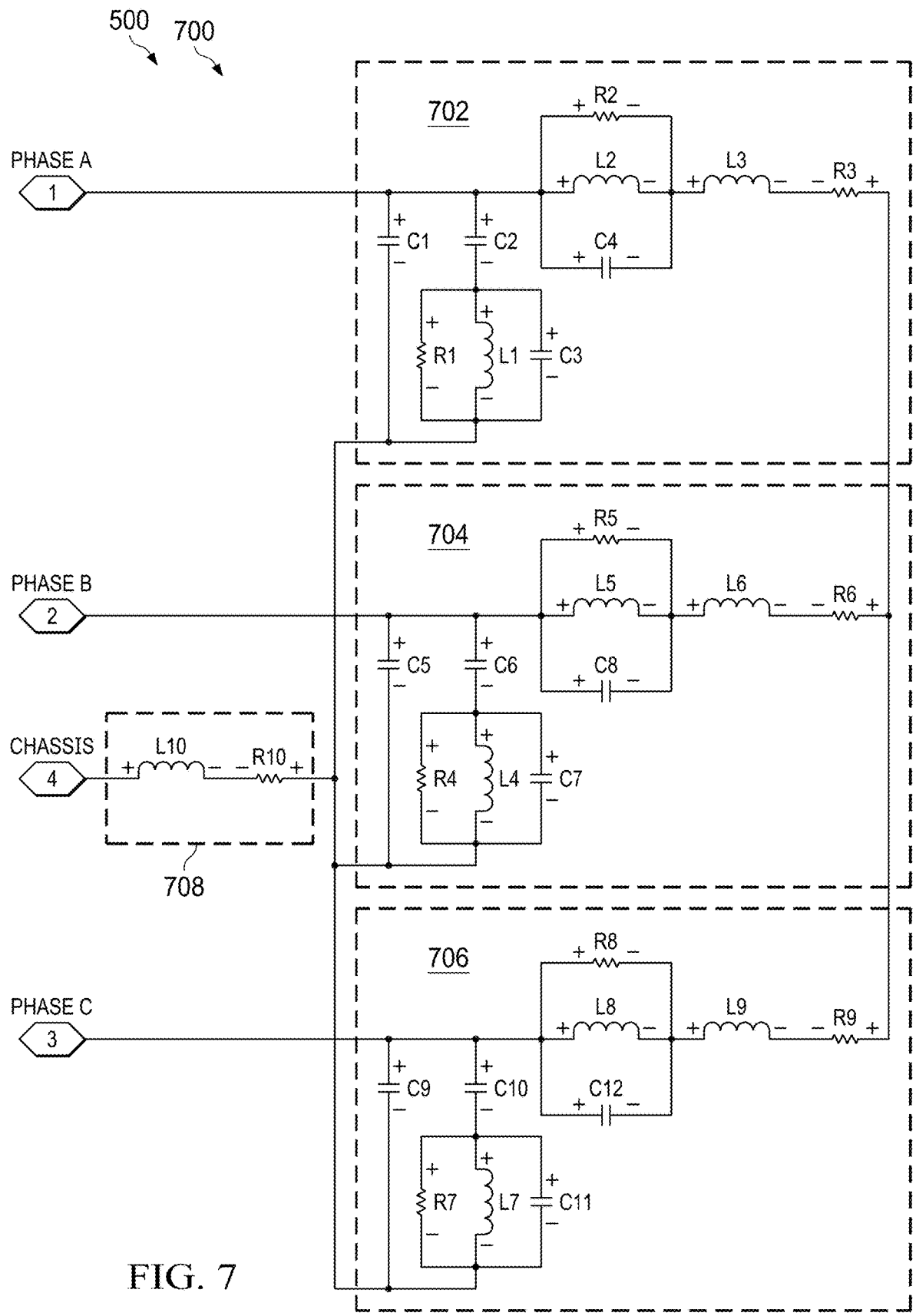
FIG. 7 is a schematic diagram of a motor circuit model in accordance with one or more example embodiments.

FIG. 7 is a schematic diagram of a motor circuit model in accordance with one or more example embodiments. Motor circuit model 700 is one example of an implementation for motor circuit model 218 in FIG. 2. Motor circuit model 700 has configuration 701, which may be one example of an implementation for configuration 220 in FIG. 2. First circuit model 500 includes first phase branch 702, second phase branch 704, third phase branch 706, and structure branch 708.

In one or more examples, each of first phase branch 702, second phase branch 704, and third phase branch 706 corresponds to or is electrically connected to a different phase of a three-phase power supply for the motor. Further, each of first phase branch 702, second phase branch 704, and third phase branch 706 is formed using the configuration of circuit devices identical to the configuration of phase portion 504 of first circuit model 500 in FIG. 5 as well as the configuration of circuit devices from first phase portion 602 (or second phase portion 604) of second circuit model 600 in FIG. 6. Structure branch 708 is formed using the configuration of circuit devices identical to the configuration of structure portion 502 of first circuit model 500 in FIG. 5.

In this manner, motor circuit model 700 is generated using circuit models (e.g., first circuit model 500 from FIG. 5 and second circuit model 600 from FIG. 6) that are determined using curve 306 in FIG. 3, which is the CM impedance curve, and curve 406 in FIG. 4, which is the DM impedance curve.

Figure 8:
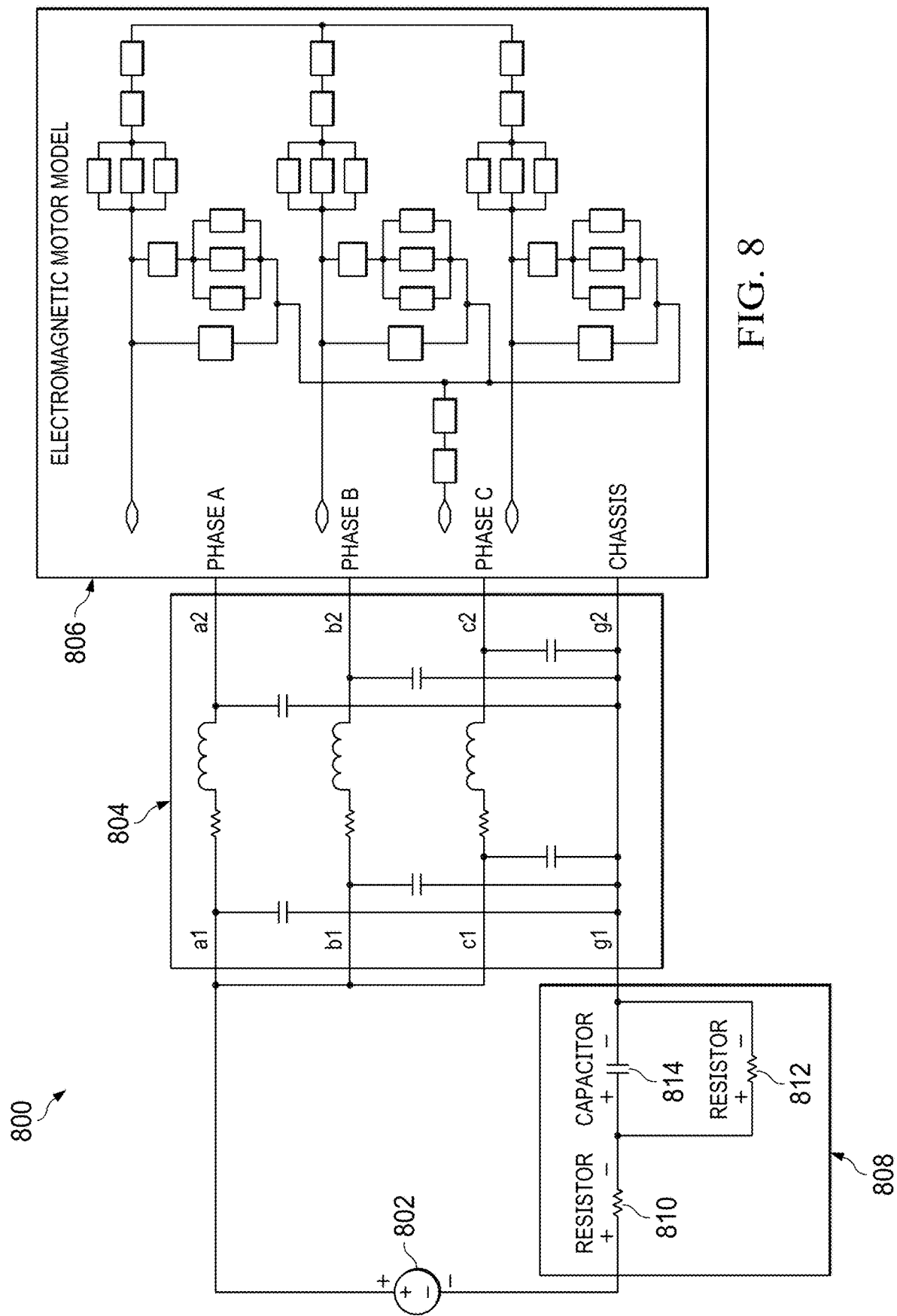
FIG. 8 is a schematic diagram of a motor system in accordance with one or more example embodiments.

FIG. 8 is a circuit diagram of a motor system in accordance with one or more example embodiments. Circuit diagram 800 represents a motor system, such as, for example, motor system 100 in FIG. 1. Circuit diagram 800 includes power component 802, transmission line component 804, motor component 806, and suppression circuit model 808.

Power component 802 represents the power supply for the motor system. In one or more examples, the power supply is considered part of the control system for the motor system. Transmission line component 804 represents the one or more transmission lines that carry current from the power supply to the motor, which is represented by motor component 806. In one or more examples, motor component 806 includes a motor circuit model such as, for example, motor circuit model 700 in FIG. 7.

Suppression circuit model 808 may be one example of an implementation for suppression circuit model 228 in FIG. 2. Suppression circuit model 808 may be determined using the motor circuit model of motor component 806. For example, suppression circuit model 808 may be determined using a set of motor formulas that correspond to the motor circuit model, such as set of motor formulas 234 in FIG. 2. As one specific example, suppression circuit model 808 may be determined using equation (1) and equation (2) described above.

In this example, suppression circuit model 808 includes resistor 810, resistor 812, and capacitor 814. In other examples, however, suppression circuit model 808 may include one or more other circuit devices in addition to or in place of resistor 810, resistor 812, capacitor 814, or a combination thereof.

In FIG. 8, transmission line component 804 is shown connected between suppression circuit model 808 and motor component 806, and suppression circuit model 808 is shown connected between power component 802 and transmission line component 804. In other examples, however, suppression circuit model 808 may be connected between transmission line component 804 and motor component 806. In still other examples, suppression circuit model 808 may be directly or indirectly connected to motor component 806 in some other manner.

Figure 9:
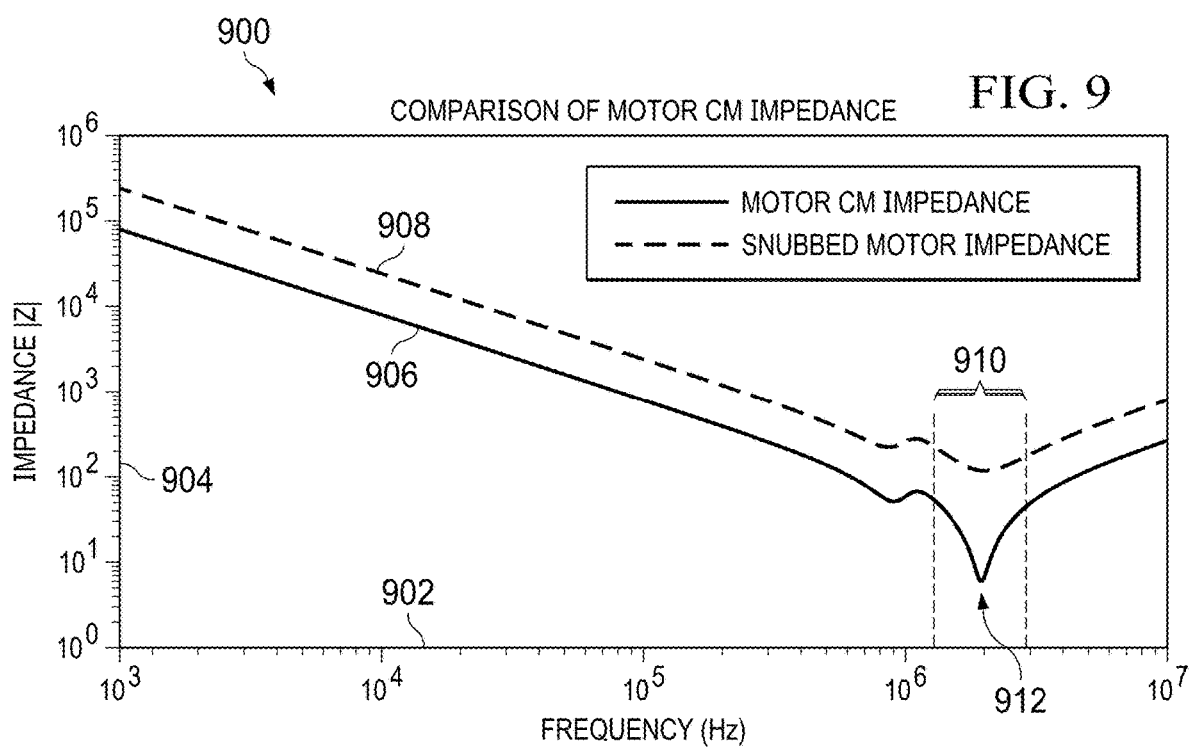
FIG. 9 is an illustration of a plot comparing common mode impedance curves for a motor in accordance with one or more example embodiments.

FIG. 9 is an illustration of a plot comparing common mode impedance curves for a motor in accordance with one or more example embodiments. Plot 900 includes x-axis 902 representing frequency and y-axis 904 representing common mode impedance. Curve 906 is a CM impedance curve for a motor. Curve 908 is a CM impedance curve for that same motor when the motor is coupled with a suppression circuit system, such as, for example, circuit system 108 in FIG. 1. This suppression circuit system may follow a model similar to suppression circuit model 228 described with respect to FIG. 2 or suppression circuit model 808 in FIG. 8.

As depicted, the suppression circuit system reduces the variation of common mode impedance within range of frequencies 910. Curve 906 has its trough (or lowest impedance) at resonant frequency 912 of the motor. Using the suppression circuit system, the common mode impedance at resonant frequency 912 is raised. This raising of the common mode impedance at resonant frequency 912 reduces the slope of curve 906 at the frequencies leading up to resonant frequency 912.

The raising of the common mode impedance at resonant frequency 912 and the reduction of variation in common mode impedance within range of frequencies 910 around resonant frequency 912 results in a reduction in CM noise, which in turn, results in a reduction or suppression of transient effects.

Range of frequencies 910 includes frequencies below and above resonant frequency 912. In one or more examples, range of frequencies 910 includes a frequency band of 1 megahertz that is centered around resonant frequency 912. In other examples, range of frequencies 910 includes a frequency band of 2 megahertz that is centered around resonant frequency 912. In still other examples, range of frequencies 910 includes a frequency band of 0.5 megahertz, 3 megahertz, or some other range that is centered around resonant frequency 912. In some cases, range of frequencies 910 is not centered around resonant frequency 912 but still includes resonant frequency 912.

Figure 10:
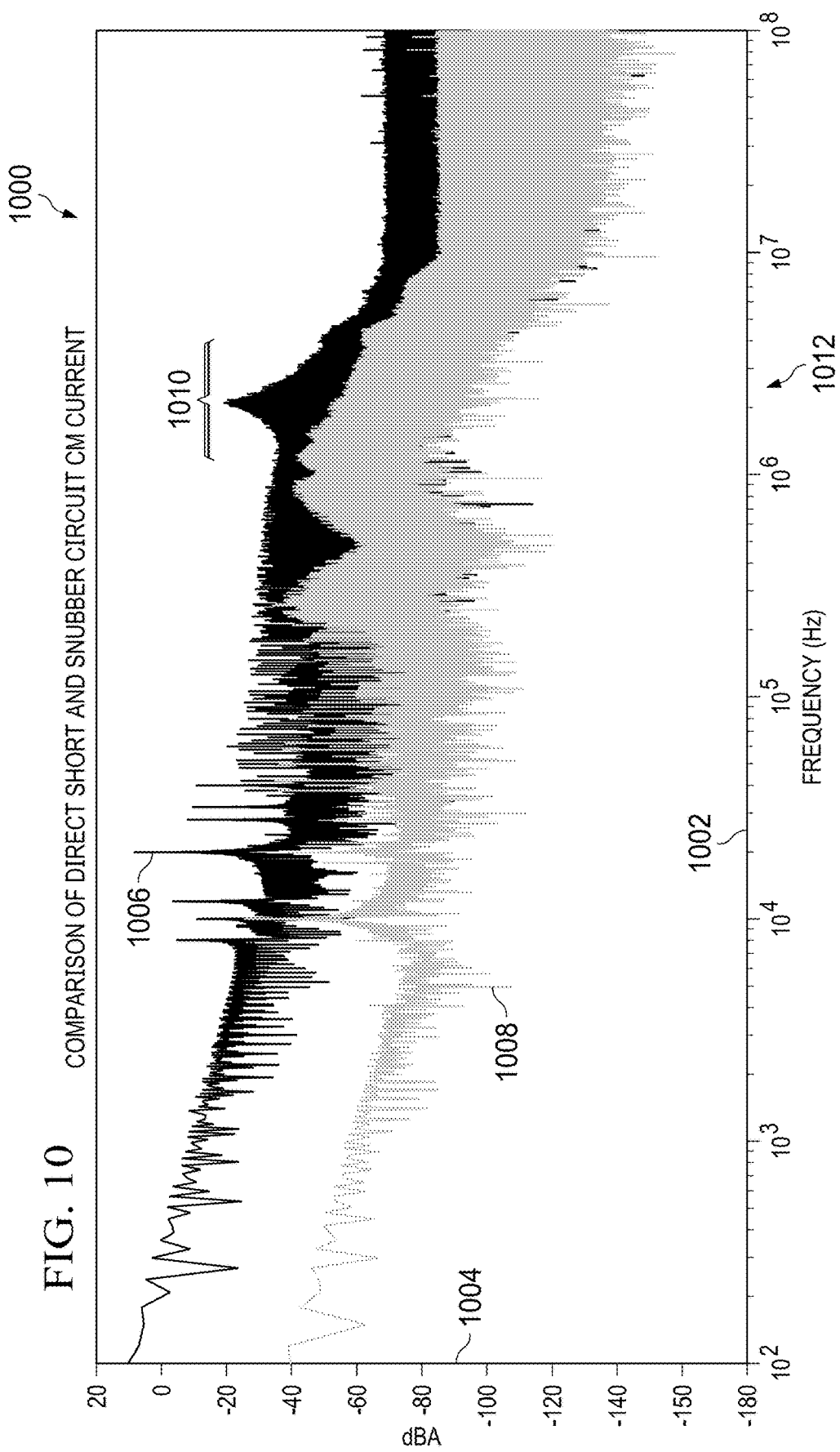
FIG. 10 is an illustration of a plot comparing spectral content of common mode current for a motor in accordance with one or more example embodiments.

FIG. 10 is an illustration of a plot comparing spectral content of common mode current for a motor in accordance with one or more example embodiments. Plot 1000 is based on the same motor on which plot 900 is based. Plot 1000 includes x-axis 1002 representing frequency and y-axis 1004 representing decibel amperes (dBA).

Spectral content 1006 is the spectral content of the CM current for the motor. Spectral content 1008 is the spectral content of the CM current for that same motor when the motor is coupled with a suppression circuit system, such as, for example, circuit system 108 in FIG. 1. Spectral content 1008 shows that using the suppression circuit system, noise is reduced within range of frequencies 1010 that includes resonant frequency 1012 of the motor.

Figure 11:
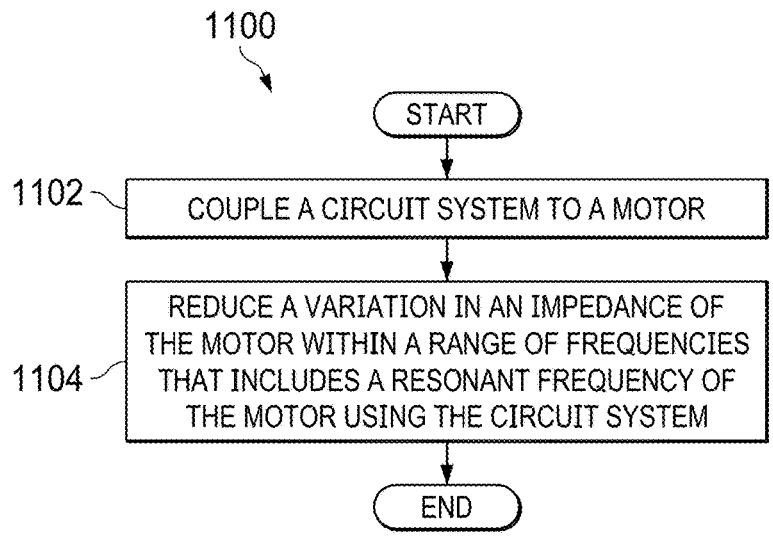
FIG. 11 is a flowchart of a process for controlling effects of a motor in accordance with an example embodiment.

FIG. 11 is a flowchart of a process for controlling effects of a motor in accordance with an example embodiment. Process 1100 may be implemented using, for example, circuit system 108 and motor 104 described with respect to FIG. 1.

A circuit system is coupled to a motor (operation 1102). The motor is an electric motor. In one or more examples, the motor is a permanent magnet motor (e.g., a permanent magnet DC motor).

A variation in an impedance of the motor within a range of frequencies that includes a resonant frequency of the motor is reduced using the circuit system (operation 1104). Reducing the variation in the impedance of the motor reduces transient effects generated by the motor at or near electrical resonance of the motor. In one or more examples, operation 1104 is performed by the circuit system raising a common mode impedance of the motor at the resonant frequency of the motor. In one or more examples, reducing the variation in the impedance includes reducing a difference between a lowest common mode impedance and a highest common mode impedance of the motor within the range of frequencies to thereby suppress noise generated by the motor at and near electrical resonance.

Figure 12:
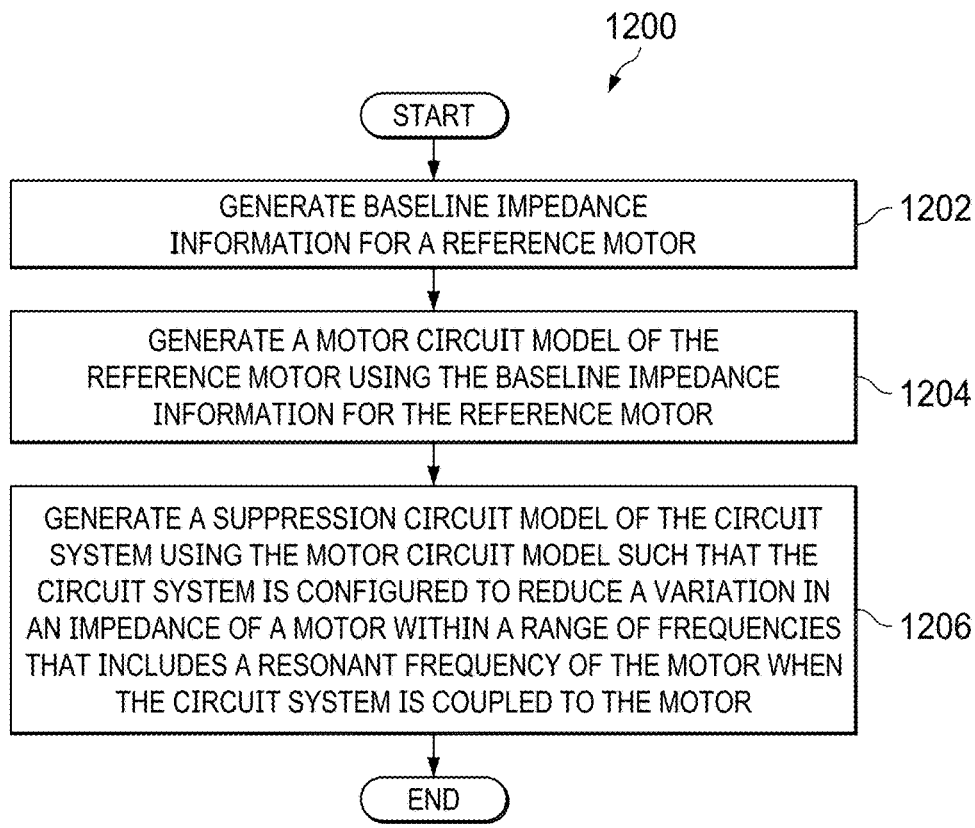
FIG. 12 is a flowchart of a process for developing a circuit system to control effects of a motor in accordance with an example embodiment.

FIG. 12 is a flowchart of a process for developing a circuit system to control effects generated by a motor in accordance with an example embodiment. Process 1200 in FIG. 12 may be implemented using, for example, design system 200 in FIG. 2 to develop circuit system 108 in FIG. 1.

Baseline impedance information is generated for a reference motor (operation 1202). Operation 1202 may be performed using a network analyzer. In one or more examples, the baseline impedance information includes S-parameter measurements that can be used to generate a set of baseline impedance curves. In other examples, the baseline impedance information includes the set of baseline impedance curves.

A motor circuit model of the reference motor is generated using the baseline impedance information for the reference motor (operation 1204). When the baseline impedance information includes the set of baseline impedance curves, operation 1204 may include using the shape of each baseline impedance curve in the set of baseline impedance curves to generate the motor circuit model. For example, the set of baseline impedance curves may include a CM impedance curve and a DM impedance curve that are used to determine different portions of the configuration of the motor circuit model. In other examples, when the baseline impedance information includes only the S-parameters measurements, operation 1204 includes generating the set of baseline curves using the S-parameter measurements.

A suppression circuit model of the circuit system is generated using the motor circuit model such that the circuit system is configured to reduce a variation in an impedance of a motor within a range of frequencies that includes a resonant frequency of the motor when the circuit system is coupled to the motor (operation 1206). The suppression circuit model generated may be used to build the circuit system. The suppression circuit model identifies the set of circuit devices and the configuration for the set of circuit devices that are needed to suppress transient effects generated by the motor at electrical resonance.

In one or more examples, the motor in operation 1206 is the reference motor. In other examples, the motor in operation 1206 is a different motor or a different type of motor.

Figure 13:
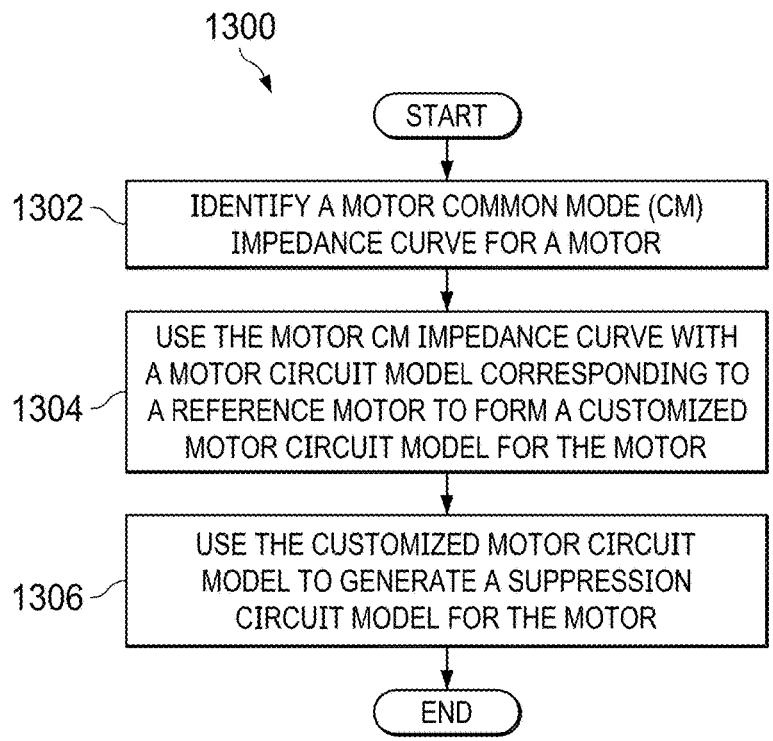
FIG. 13 is a flowchart of a process for developing a circuit system to control effects of a motor in accordance with an example embodiment.

FIG. 13 is a flowchart of a process for developing a circuit system to control effects of a motor in accordance with an example embodiment. Process 1300 in FIG. 13 may be implemented using, for example, design system 200 in FIG. 2 to develop circuit system 108 in FIG. 1. In one or more examples, process 1300 may be used to implement operation 1204 in FIG. 12 and generate a suppression circuit model for the circuit system.

Process 1300 may begin by identifying a motor CM impedance curve for a motor (operation 1302). The motor CM impedance curve may be for example, one curve in set of motor impedance curves 232 in FIG. 2. In one or more examples, operation 1302 is performed by identifying the motor CM impedance curve from motor impedance information generated for the motor using a network analyzer. The motor impedance information may be, for example, motor impedance information 230.

The motor CM impedance curve is used with a motor circuit model corresponding to a reference motor to form a customized motor circuit model for the motor (operation 1304). The motor circuit model may be, for example, motor circuit model 218 in FIG. 2. In one or more examples, the motor circuit model is the motor circuit model generated for the reference motor in operation 1204 in FIG. 12. The motor described in process 1300 may be the same reference motor from FIG. 12 or a different motor.

In one or more examples, operation 1304 may be performed by solving for a set of base formulas corresponding to the motor circuit model using the motor CM impedance curve. The set of base formulas is defined based on the configuration of the motor circuit model. Solving for the set of base formulas includes identifying values for the various circuit devices that make up the configuration of the motor circuit model. The motor circuit model having these values for the circuit devices in the motor circuit model is considered customized for the motor.

The customized motor circuit model is used to generate a suppression circuit model for the motor (operation 1306). Operation 1306 may be performed by, for example, determining which circuit, when coupled to the motor, would reduce a variation in an impedance of the motor within a range of frequencies that includes the resonant frequency of the motor. In other examples, the suppression circuit model may be generated to modify the impedance of the motor within the range of frequencies in some other manner.

Figure 14:
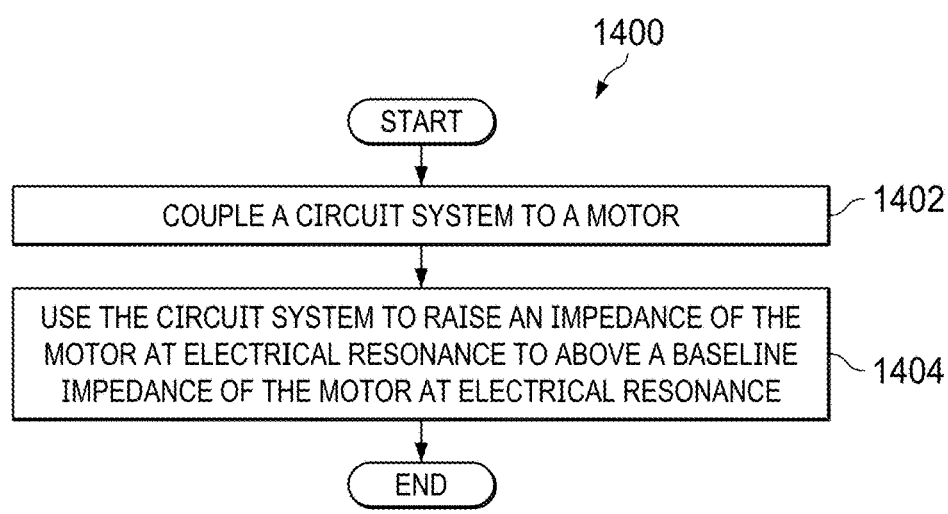
FIG. 14 is a flowchart of a process for controlling effects of a motor in accordance with an example embodiment.

FIG. 14 is a flowchart of a process for controlling effects of a motor in accordance with an example embodiment. Process 1400 in FIG. 14 may be implemented using, for example, circuit system 108 in FIG. 1 and motor 104 in FIG. 1.

A circuit system is coupled to a motor (operation 1402). The motor is an electric motor. In one or more examples, the motor is a permanent magnet motor (e.g., a permanent magnet DC motor).

The impedance of the motor at electrical resonance is raised using the circuit system to above a baseline impedance of the motor at electrical resonance (operation 1404). In one or more examples, the impedance and baseline impedance are common mode impedance. Further, the baseline impedance may be the impedance of the motor when the circuit system is not coupled to the motor. Operation 1404 may be performed to raise the impedance above the baseline impedance by at least a selected amount.

In one or more examples, the circuit system is used to raise the magnitude of the impedance by at least, for example, 20 Ohms, 30 Ohms, 50 Ohms, 60 Ohms, 5 Ohms, 80 Ohms, 100 Ohms, 150 Ohms, or some other number of Ohms. In some examples, the circuit system is generated so as to raise the magnitude of the impedance by at least, for example, a number of Ohms selected between about 20 Ohms and about 1000 Ohms.

In one or more examples, in operation 1404, raising the impedance of the motor at electrical resonance includes raising the common mode impedance of the motor at the resonant frequency of the motor. Further, in one or more examples, raising the impedance of the motor at electrical resonance may also include raising the common mode impedance of the motor within a range of frequencies around the resonant frequency. This type of modification may result in a flattening (or at least reduction of slope/steepness) at the dip in the common mode impedance curve corresponding to the motor.

Figure 15:
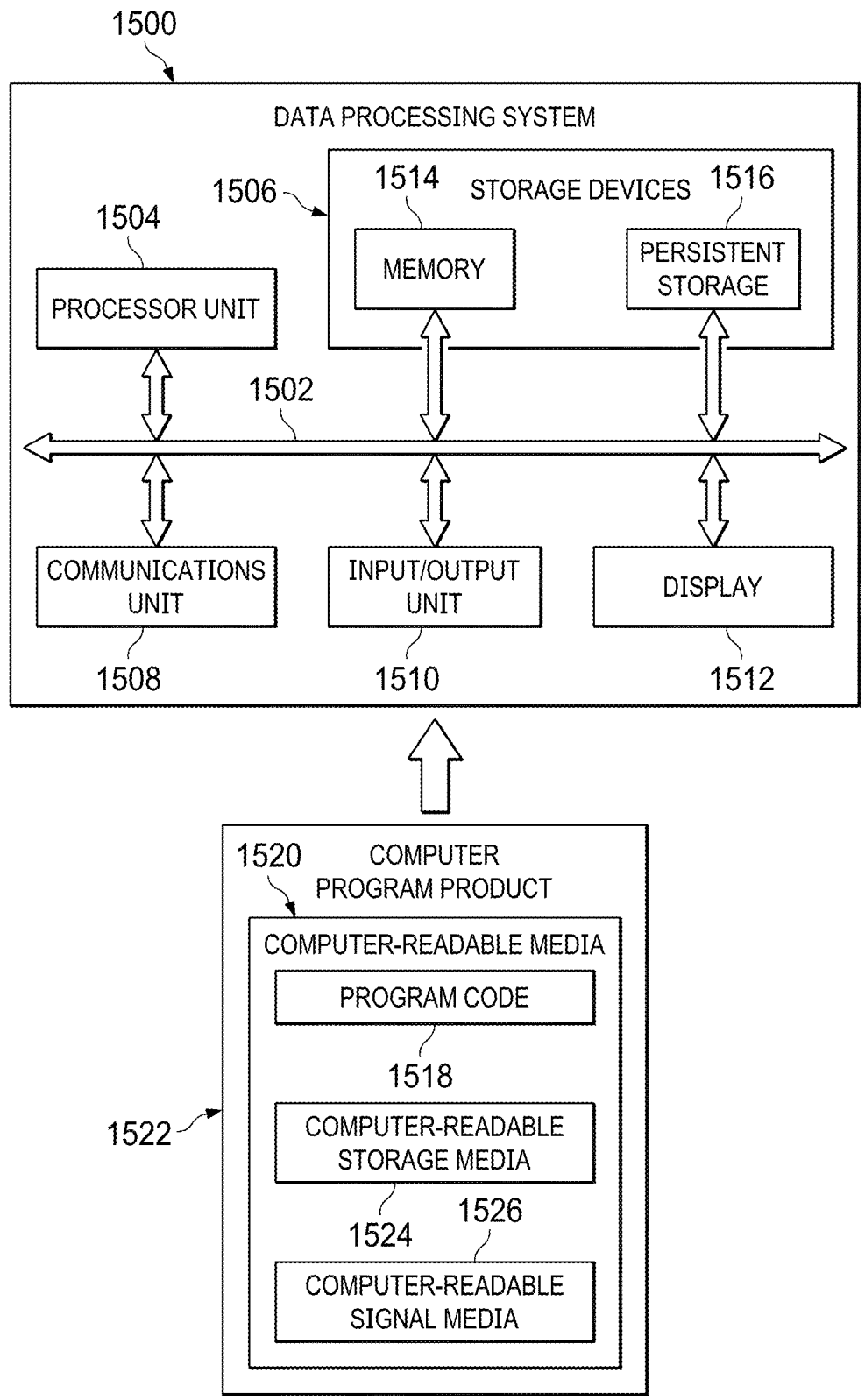
FIG. 15 is a block diagram of a data processing system in accordance with an example embodiment.

Turning now to FIG. 15, an illustration of a data processing system in the form of a block diagram is depicted in accordance with an example embodiment. Data processing system 1500 may be used to implement computer system 206 in FIG. 2. As depicted, data processing system 1500 includes communications framework 1502, which provides communications between processor unit 1504, storage devices 1506, communications unit 1508, input/output unit 1510, and display 1512. In some cases, communications framework 1502 may be implemented as a bus system.

Processor unit 1504 is configured to execute instructions for software to perform a number of operations. Processor unit 1504 may comprise a number of processors, a multi-processor core, and/or some other type of processor, depending on the implementation. In some cases, processor unit 1504 may take the form of a hardware unit, such as a circuit system, an application specific integrated circuit (ASIC), a programmable logic device, or some other suitable type of hardware unit.

Instructions for the operating system, applications, and/or programs run by processor unit 1504 may be located in storage devices 1506. Storage devices 1506 may be in communication with processor unit 1504 through communications framework 1502. As used herein, a storage device, also referred to as a computer-readable storage device, is any piece of hardware capable of storing information on a temporary and/or permanent basis. This information may include, but is not limited to, data, program code, and/or other information.

Memory 1514 and persistent storage 1516 are examples of storage devices 1506. Memory 1514 may take the form of, for example, a random-access memory or some type of volatile or non-volatile storage device. Persistent storage 1516 may comprise any number of components or devices. For example, persistent storage 1516 may comprise a hard drive, a flash memory, a rewritable optical disk, a rewritable magnetic tape, or some combination of the above. The media used by persistent storage 1516 may or may not be removable.

Communications unit 1508 allows data processing system 1500 to communicate with other data processing systems and/or devices. Communications unit 1508 may provide communications using physical and/or wireless communications links.

Input/output unit 1510 allows input to be received from and output to be sent to other devices connected to data processing system 1500. For example, input/output unit 1510 may allow user input to be received through a keyboard, a mouse, and/or some other type of input device. As another example, input/output unit 1510 may allow output to be sent to a printer connected to data processing system 1500.

Display 1512 is configured to display information to a user. Display 1512 may comprise, for example, without limitation, a monitor, a touch screen, a laser display, a holographic display, a virtual display device, and/or some other type of display device.

In this illustrative example, the processes of the different example embodiments may be performed by processor unit 1504 using computer-implemented instructions. These instructions may be referred to as program code, computer-usable program code, or computer-readable program code and may be read and executed by one or more processors in processor unit 1504.

In these examples, program code 1518 is located in a functional form on computer-readable media 1520, which is selectively removable, and may be loaded onto or transferred to data processing system 1500 for execution by processor unit 1504. Program code 1518 and computer-readable media 1520 together form computer program product 1522. In this illustrative example, computer-readable media 1520 may be computer-readable storage media 1524 or computer-readable signal media 1526.

Computer-readable storage media 1524 is a physical or tangible storage device used to store program code 1518 rather than a medium that propagates or transmits program code 1518. Computer-readable storage media 1524 may be, for example, without limitation, an optical or magnetic disk or a persistent storage device that is connected to data processing system 1500.

Alternatively, program code 1518 may be transferred to data processing system 1500 using computer-readable signal media 1526. Computer-readable signal media 1526 may be, for example, a propagated data signal containing program code 1518. This data signal may be an electromagnetic signal, an optical signal, and/or some other type of signal that can be transmitted over physical and/or wireless communications links.

The illustration of data processing system 1500 in FIG. 15 is not meant to provide architectural limitations to the manner in which the example embodiments may be implemented. The different example embodiments may be implemented in a data processing system that includes components in addition to or in place of those illustrated for data processing system 1500. Further, components shown in FIG. 15 may be varied from the illustrative examples shown.

Figure 16:
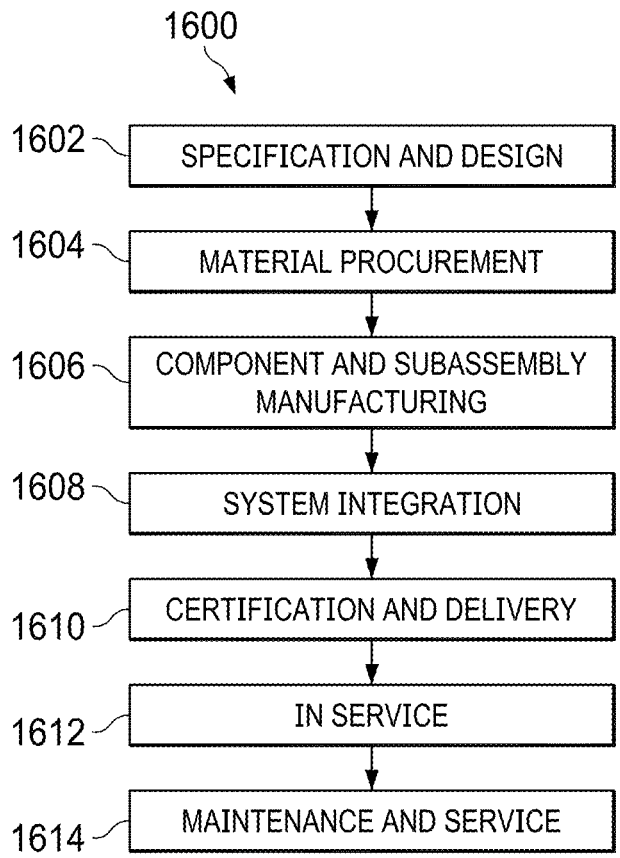
FIG. 16 is an illustration of an aircraft manufacturing and service method in accordance with an example embodiment.
Figure 17:
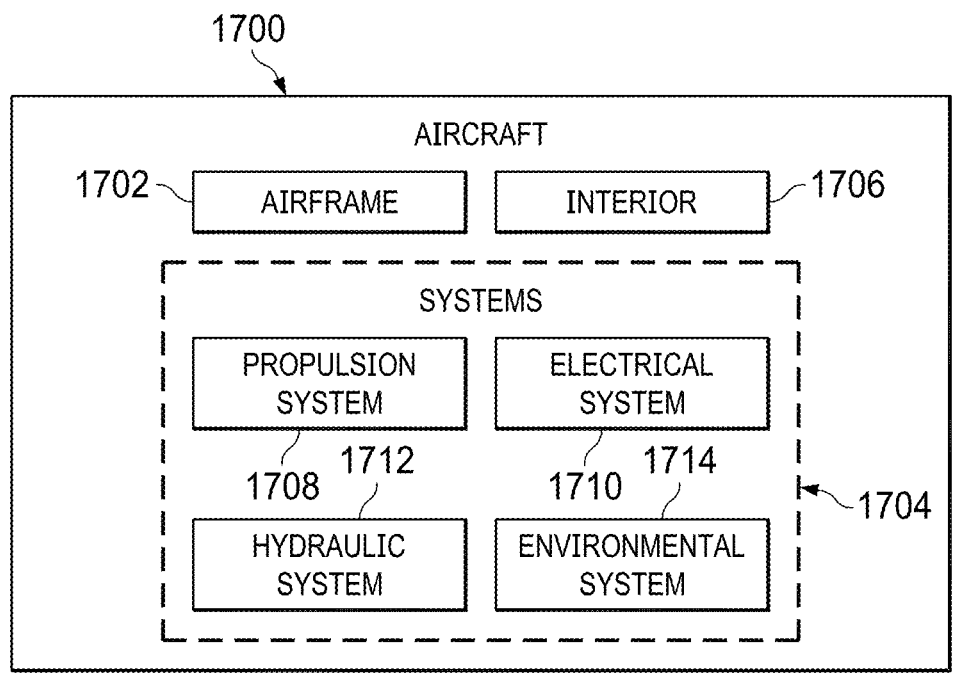
FIG. 17 is a block diagram of an aircraft in accordance with an example embodiment.

Example embodiments of the disclosure may be described in the context of aircraft manufacturing and service method 1600 as shown in FIG. 16 and aircraft 1700 as shown in FIG. 17. Turning first to FIG. 16, an illustration of an aircraft manufacturing and service method is depicted in accordance with an example embodiment. During pre-production, aircraft manufacturing and service method 1600 may include specification and design 1602 of aircraft 1700 in FIG. 17 and material procurement 1604.

During production, component and subassembly manufacturing 1606 and system integration 1608 of aircraft 1700 in FIG. 17 takes place. Thereafter, aircraft 1700 in FIG. 17 may go through certification and delivery 1610 in order to be placed in service 1612. While in service 1612 by a customer, aircraft 1700 in FIG. 17 is scheduled for routine maintenance and service 1614, which may include modification, reconfiguration, refurbishment, and other maintenance or service.

Each of the processes of aircraft manufacturing and service method 1600 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 17, an illustration of an aircraft is depicted in which an example embodiment may be implemented. In this example, aircraft 1700 is produced by aircraft manufacturing and service method 1600 in FIG. 16 and may include airframe 1702 with plurality of systems 1704 and interior 1706. Examples of systems 1704 include one or more of propulsion system 1708, electrical system 1710, hydraulic system 1712, and environmental system 1714. Any number of other systems may be included. Although an aerospace example is shown, different example embodiments may be applied to other industries, such as the automotive industry.

Apparatuses and methods embodied herein may be employed during at least one of the stages of aircraft manufacturing and service method 1600 in FIG. 16. In particular, fabrication system 164 from FIG. 1 may be used to fabricate tool 162 during any one of the stages of aircraft manufacturing and service method 1600. For example, without limitation, fabrication system 164 from FIG. 1 may be used to fabricate tool 162 during at least one of component and subassembly manufacturing 1606, system integration 1608, routine maintenance and service 1614, or some other stage of aircraft manufacturing and service method 1600. Still further, fabrication system 164 from FIG. 1 may be used to fabricate tool 162 for use in fabricating composite parts for at least one of airframe 1702 or interior 1706 of aircraft 1700 in FIG. 17.

In one illustrative example, components or subassemblies produced in component and subassembly manufacturing 1606 in FIG. 16 may be fabricated or manufactured in a manner similar to components or subassemblies produced while aircraft 1700 is in service 1612 in FIG. 16. As yet another example, one or more apparatus embodiments, method embodiments, or a combination thereof may be utilized during production stages, such as component and subassembly manufacturing 1606 and system integration 1608 in FIG. 16. One or more apparatus embodiments, method embodiments, or a combination thereof may be utilized while aircraft 1700 is in service 1612 and/or during maintenance and service 1614 in FIG. 16. The use of a number of the different example embodiments may substantially expedite the assembly of and/or reduce the cost of aircraft 1700. Further, one or more embodiments described herein may be used as part of propulsion system 1708 of aircraft 1700.

The flowcharts and block diagrams in the different depicted embodiments illustrate the architecture, functionality, and operation of some possible implementations of apparatuses and methods in an example embodiment. In this regard, each block in the flowcharts or block diagrams may represent a module, a segment, a function, and/or a portion of an operation or step.

In some alternative implementations of an example embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

As used herein, the phrase "at least one of," when used with a list of items, means different combinations of one or more of the listed items may be used and only one of the items in the list may be needed. The item may be a particular object, thing, step, operation, process, or category. In other words, "at least one of" means any combination of items or number of items may be used from the list, but not all of the items in the list may be required. For example, without limitation, "at least one of item A, item B, or item C" or "at least one of item A, item B, and item C" may mean item A; item A and item B; item B; item A, item B, and item C; item B and item C; or item A and C. In some cases, "at least one of item A, item B, or item C" or "at least one of item A, item B, and item C" may mean, but is not limited to, two of item A, one of item B, and ten of item C; four of item B and seven of item C; or some other suitable combination.

In one or more example embodiments, a system comprises a network analyzer and a model generator. The network analyzer is configured to generate baseline impedance information for a reference motor. The model generator is configured to generate a motor circuit model of the reference motor using the baseline impedance information for the reference motor. The model generator is further configured to generate a suppression circuit model of a circuit system using the motor circuit model such that the circuit system is configured to reduce a variation in an impedance of a motor within a range of frequencies that includes a resonant frequency of the motor when the circuit system is coupled to the motor.

In the one or more example embodiments, the motor of the at least first embodiment may be a reference motor.

In the first example embodiment, the baseline impedance information may comprise S-parameter measurements and the model generator may be further configured to generate a set of baseline impedance curves using the S-parameter measurements.

In the one or more example embodiments, the baseline impedance information may comprise a set of baseline impedance curves corresponding to the motor.

In the one or more example embodiments, the motor may be a permanent magnet motor.

In the one or more example embodiments, the motor circuit model may have a configuration that is applicable to at least one other motor that is different from the reference motor.

In the one or more example embodiments, the model generator may be configured to generate a set of base formulas corresponding to a configuration of the motor circuit model and to identify values for a plurality of circuit devices in the motor circuit model using the baseline impedance information to transform the set of base formulas into a set of motor formulas.

In the one or more example embodiments, the model generator may be configured to generate the suppression circuit model for the circuit system using the set of motor formulas.

In the one or more example embodiments, the range of frequencies includes a band of about 1 megahertz around the resonant frequency.

In the one or more example embodiments, the range of frequencies includes a band of about 2 megahertz around the resonant frequency.

In one or more example embodiments, a method is provided for developing a circuit system to control effects generated by a motor. The method may include generating baseline impedance information for a reference motor; generating a motor circuit model of the reference motor using the baseline impedance information for the reference motor; and generating a suppression circuit model of the circuit system using the motor circuit model such that the circuit system is configured to reduce a variation in an impedance of the motor within a range of frequencies that includes a resonant frequency of the motor when the circuit system is coupled to the motor.

In the one or more example embodiments, the method may include building the circuit system based on the suppression circuit model; and coupling the circuit system to the motor.

In one or more example embodiments, a non-transitory computer-readable medium, storing computer instructions thereon, is provided. The non-transitory computer-readable medium comprises machine-executable code that, when run by at least one machine, causes the at least one machine to: generate a set of baseline impedance curves corresponding to the motor using a network analyzer; generate a motor circuit model of the motor using the set of baseline impedance curves; and generate a suppression circuit model for a circuit system using the motor circuit model such that the circuit system is configured to reduce a variation in the impedance of the motor within a range of frequencies that includes a resonant frequency of the motor when the circuit system is coupled to the motor.

In the one or more example embodiments, a baseline impedance curve of the set of baseline impedance curves is a function of frequency.

In one or more example embodiments, a method for controlling effects generated by a motor includes operating the motor; and reducing a variation in an impedance of the motor within a range of frequencies that includes a resonant frequency of the motor using a circuit system.

The description of the different example embodiments has been presented for purposes of illustration and description and is not intended to be exhaustive or limited to the embodiments in the form disclosed. Many modifications and variations will be apparent to those of ordinary skill in the art. Further, different example embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system comprising:
a circuit system configured to be coupled to a motor such that the circuit system reduces a variation in an impedance of the motor within a range of frequencies that includes a resonant frequency of the motor;
wherein the circuit system is configured to reduce the variation in the impedance by reducing a difference between a lowest impedance and a highest impedance of the motor within the range of frequencies to thereby suppress noise generated by the motor.

2. The system of claim 1, wherein the circuit system is configured to reduce the variation in the impedance by raising a common mode impedance of the motor at the resonant frequency of the motor to thereby reduce transient effects generated by the motor.

3. The system of claim 1, wherein the motor is a three-phase motor, and the circuit system comprises three branches configured to be electrically connected to respective different phases of a three-phase power supply for the motor.

4. The system of claim 1, wherein the circuit system is configured to reduce the variation in the impedance by reducing a slope of a portion of a common mode impedance curve corresponding to the motor between the resonant frequency and a lower frequency within the range of frequencies.

5. The system of claim 1, wherein the circuit system comprises:
a set of circuit devices including at least one of a resistor, a capacitor, or an inductor.

6. The system of claim 1, wherein the impedance comprises a common mode impedance, and the circuit system reduces a variation in the impedance of the motor by reducing a difference between a lowest common mode impedance and a highest common mode impedance of the motor within the range of frequencies that are near the resonant frequency of the motor.

7. The system of claim 1, further comprising:
the motor.

8. The system of claim 7, further comprising:
a structure associated with the motor, wherein the circuit system is configured to suppress transient effects driven onto the structure by the motor.

9. The system of claim 8, wherein the structure is physically associated with a vehicle.

10. The system of claim 9, wherein the vehicle is an aircraft.

11. The system of claim 8, wherein the structure is a chassis.

12. The system of claim 1, wherein the motor is a permanent magnet motor.

13. A motor system comprising:
an electric motor; and
a circuit system coupled to the electric motor, wherein the circuit system is configured to reduce a difference between a lowest common mode impedance and a highest common mode impedance of the electric motor within a range of frequencies that includes a resonant frequency of the electric motor.

14. The motor system of claim 13, wherein the circuit system is configured to reduce the difference between the lowest common mode impedance and the highest common mode impedance of the electric motor within the range of frequencies to thereby suppress transient effects generated at an electrical resonance of the electric motor.

15. A method for controlling effects generated by a motor, the method comprising:
   coupling a circuit system to the motor; and
   reducing a difference between a lowest common mode impedance and a highest common mode impedance of the motor within a range of frequencies that includes a resonant frequency of the motor using the circuit system.

16. The method of claim 15, wherein reducing the difference comprises: reducing a variation in the impedance of the motor within the range of frequencies using the circuit system to thereby suppress transient effects driven onto a structure associated with the motor at an electrical resonance of the motor.

17. The method of claim 15, further comprising:
   generating a set of baseline impedance curves corresponding to the motor; and
   generating a motor circuit model of the motor combined with the circuit system using the set of baseline impedance curves.

18. The method of claim 17, wherein generating the set of baseline impedance curves comprises:
   generating a baseline common mode impedance curve and a baseline differential mode impedance curve corresponding to the motor.

19. The method of claim 15, further comprising:
   generating a suppression circuit model for the circuit system, wherein the suppression circuit model is designed to reduce the difference between the lowest common mode impedance and the highest common mode impedance of the motor within the range of frequencies that includes the resonant frequency.

20. The method of claim 19, further comprising:
   building the circuit system based on the suppression circuit model using a set of circuit devices.

* * * * *